United States Patent
Terauchi et al.

(10) Patent No.: US 6,753,233 B2
(45) Date of Patent: Jun. 22, 2004

(54) METHOD OF MANUFACTURING SEMICONDUCTOR DEVICE, AND SEMICONDUCTOR DEVICE HAVING MEMORY CELL

(75) Inventors: Takashi Terauchi, Tokyo (JP); Akinobu Teramoto, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 10 days.

(21) Appl. No.: 09/976,341

(22) Filed: Oct. 15, 2001

(65) Prior Publication Data

US 2002/0149068 A1 Oct. 17, 2002

(30) Foreign Application Priority Data

Apr. 16, 2001 (JP) .......................... 2001-116398

(51) Int. Cl.[7] .................. H01L 21/336; H01L 21/3205; H01L 21/4763
(52) U.S. Cl. .................. 438/304; 438/585; 438/596
(58) Field of Search .................. 438/585, 304, 438/596, 231, 258, 261

(56) References Cited

U.S. PATENT DOCUMENTS 5,654,212 A * 8/1997 Jang
6,121,087 A * 9/2000 Mann et al.
6,208,004 B1 * 3/2001 Cunningham

FOREIGN PATENT DOCUMENTS

| JP | 2000-243724 | 9/2000 |
| KR | 2000-0043546 | 7/2000 |
| KR | 2000-0044924 | 7/2000 |

* cited by examiner

Primary Examiner—John F. Niebling
Assistant Examiner—Ron Pompey
(74) Attorney, Agent, or Firm—McDermott, Will & Emery

(57) ABSTRACT

A gate oxide film is formed on a substrate. Next, gate interconnections, each including a first silicon film, a silicide film and a dielectric film, are formed on the gate oxide film. Next, an impurity is implanted into the substrate while the gate interconnections are taken as a mask, thereby forming a first diffusion layer. Next, a second silicon film is formed over the entire surface of the substrate so as to cover the gate interconnections. Next, the second silicon film is thermally oxidized, thereby forming a thermal oxide film. An interlayer dielectric film is formed on the thermal oxide film.

14 Claims, 11 Drawing Sheets

US 6,753,233 B2

METHOD OF MANUFACTURING SEMICONDUCTOR DEVICE, AND SEMICONDUCTOR DEVICE HAVING MEMORY CELL

BACKGROUND OF THE INVENTION

1. Field of the Invention

The present invention relates to a method of manufacturing a semiconductor device and to a semiconductor device. More particularly, the present invention relates to the formation of a transistor having a memory cell and to the subsequent formation of an interlayer dielectric film.

2. Description of the Background Art

In order to suppress gate-induced drain leakage (GIDL) caused by concentration of an electric field on a gate edge (which will be described later), sidewalls of a gate interconnection are subjected to thermal oxidation, thereby forming a gate bird's beak on the gate edge.

A. A conventional method of manufacturing a semiconductor device will be described hereinbelow.

FIGS. 26 through 31 are cross-sectional views for describing a conventional method of manufacturing a semiconductor device.

First, as shown in FIG. 26, a gate oxide film 2 is formed on a substrate 1. Next, a silicon film 3 is formed from; e.g., a phosphorus-doped polysilicon film or a phosphorus-doped amorphous silicon film, on the gate oxide film 2. A silicide film 4 is formed on the silicon film 3. Further, a dielectric film 5 is formed on the silicide film 4.

Next, as shown in FIG. 27, a resist pattern 6a is formed on the dielectric film 5 through the photolithography process.

As shown in FIG. 28 the dielectric film 5 is subjected to dry etching while the resist pattern 6a is taken as a mask, whereby the dielectric film 5 is patterned. Subsequently, the resist pattern 6a is removed.

Next, as shown in FIG. 29, the silicide film 4 and the silicon film 3 are subjected to dry-etching while the thus-patterned dielectric film 5 is taken as a mask. As a result, gate interconnections of desired geometry are formed.

Next, as shown in FIG. 30, source/drain regions 6 are formed in the substrate 1 by means of implanting an impurity into the substrate 1 while the gate interconnections are taken as masks.

Next, as shown in FIG. 31, the substrate 1 is subjected to thermal oxidation, thereby forming a thermal oxide film 17 on the sides of the silicon film 3 and on the sides of the silicide film 4, which the films 3 and 4 together constitute the gate interconnection, as well as on the substrate 1.

Through thermal oxidation, edges (hereinafter called "gate edges") of each of the gate interconnections are rounded, thereby forming gate bird's beaks. Accordingly, there can be prevented generation of hot carriers (also called hot electrons), which would otherwise be caused by concentration of an electric field on the gate edges.

Moreover, damage stemming from dry etching or damage resulting from impurity implanting is eliminated through thermal oxidation.

However, the semiconductor device manufactured by the conventional manufacturing method poses the following problems. FIG. 32 is a cross-sectional view for describing a semiconductor device manufactured by the conventional manufacturing method. FIG. 33 is a cross-sectional view for describing that embedding failures have occurred in an interlayer dielectric film of the semiconductor device manufactured by the conventional manufacturing method.

As shown in FIG. 32, silicon (Si) components contained in the silicon film 3 and those contained in the silicide film 4 are subjected to thermal oxidation in the thermal oxidation process, thereby forming the thermal oxide film 17. There arises a first problem of the thermal oxide film 17 receding to the inside of a gate interconnection with reference to the side surfaces of the dielectric film 5. More specifically, the width A of the gate interconnection becomes narrower than that of the gate interconnection formed immediately after etching (i.e., at the time of formation of the gate interconnection), by only the extent to which the thermal oxide film 17 recedes. This results in an increase in the resistance of the gate interconnection, which in turn deteriorates the drive performance of a transistor.

A second problem is that a thermal oxide film 17a formed on the side surfaces of the silicide film 4 becomes thicker than a thermal oxide film 17b formed on the side surfaces of the silicon film 3. In short, both sides of the silicide film 4 assume a bulging shape. This phenomenon is attributable to the silicide film 4 being oxidized to a greater extent than is the silicon film 3.

As shown in FIG. 33, when an interlayer dielectric film 9 is deposited after formation of the thermal oxide film 17, an embedding failure D arises. Even when the substrate 1 is subjected to heat treatment (e.g., a reflow process) in an atmosphere of $O_2$, $N_2$, and $H_2O$ after formation of the interlayer dielectric film 9, the embedding failure D is not removed. The embedding failure D extends both toward and away from the viewer of FIG. 33. The embedding failure D brings into conduction a plurality of contacts arranged in the extending direction of the embedding failure D. The thus-manufactured semiconductor device does not operate properly and becomes defective, thereby deteriorating manufacturing yield.

A third problem is that silicon components in the silicide film 4 are reduced with the progress of thermal oxidation and that the silicide film 4 takes up silicon components in the lower silicon film 3 for replenishing depleted silicon components (as indicated by an arrow B shown in FIG. 32). As a result, volume expansion arises in the silicide film 4, and the silicide film 4 spreads into the lower silicon film 3 (as indicated by an arrow C shown in FIG. 32). In this case, stress is exerted up to the gate oxide film 2 located below the silicon film 3, thereby resulting in a decline in the reliability of the gate oxide film 2. Eventually, the reliability of a semiconductor device also deteriorates.

SUMMARY OF THE INVENTION

The present invention has been conceived to solve the previously-mentioned problems and a general object of the present invention is to provide a novel and useful method of manufacturing a semiconductor device, and is to a novel and useful semiconductor device.

A more specific object of the present invention is to form gate bird's beaks without involvement of an increase in the resistance of a gate interconnection and to facilitate embedding of an interlayer dielectric film between gate interconnections.

The above object of the present invention is attained by a following method of manufacturing a semiconductor device and a following semiconductor device.

According to first aspect of the present invention, the method of manufacturing a semiconductor device, comprises the steps of: forming a gate oxide film on a substrate; forming gate interconnections on the gate oxide film, each gate interconnection including a first silicon film and a dielectric film; forming a first diffusion layer by means of implanting an impurity into the substrate while the gate interconnections are taken as a mask; forming a second silicon film over the entire surface of the substrate so as to cover the gate interconnections, after formation of the first diffusion layer; thermally-oxidizing the second silicon film, thereby forming a thermal oxide film; and forming an interlayer dielectric film on the thermal oxide film.

According to second aspect of the present invention, the method of manufacturing a semiconductor device, comprises the steps of: forming a gate oxide film on a substrate; forming gate interconnections on the gate oxide film, each gate interconnection including a first silicon film and a dielectric film; forming a first diffusion layer by means of implanting an impurity into the substrate while the gate interconnections are taken as a mask; forming after formation of the first diffusion layer a second silicon film over the side surfaces of the first silicon film; thermally-oxidizing the second silicon film, thereby forming a thermal oxide film; and forming, after formation of the thermal oxide film, an interlayer dielectric film over the entire surface of the substrate so as to cover the gate interconnections.

According to third aspect of the present invention, the semiconductor device comprises: a substrate; a gate oxide film formed on the substrate; a plurality of gate interconnections which are formed on the gate oxide film, each of the gate interconnections including a first silicon film and a dielectric film; an impurity diffusion layer formed in the substrate between the gate interconnections; a thermal oxide film covering each of the gate electrodes; and an interlayer dielectric film formed on the thermal oxide film; wherein a side surface of the dielectric film and a side surface of the first silicon film constitute a single plane.

Other objects and further feature of the present invention will be apparent from the following detailed description when read in conjunction with the accompanying drawings.

DETAILED DESCRIPTION OF THE PREFERRED EMBODIMENTS

Figure 1:
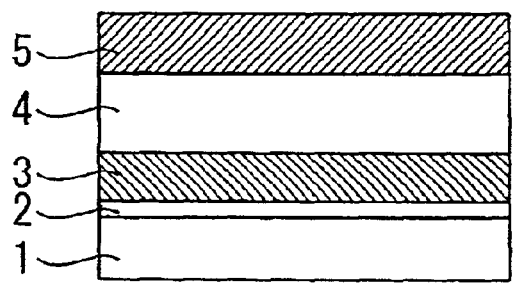
FIGS. 1 through 8 are cross-sectional views for describing a method of manufacturing a semiconductor device according to a first embodiment of the present invention.

In the following, principles and embodiments of the present invention will be described with reference to the accompanying drawings. The members and steps that are common to some of the drawings are given the same reference numerals and redundant descriptions therefore may be omitted.

First Embodiment

FIGS. 1 through 8 are cross-sectional views for describing a method of manufacturing a semiconductor device according to a first embodiment of the present invention.

A method of manufacturing a semiconductor device according to the first embodiment will now be described.

As shown in FIG. 1, a gate oxide film 2 is formed on a substrate 1 to a thickness of 5 to 10 nm. The gate oxide film 2 is a silicon oxide film formed through thermal oxidation, or a non-doped silicon oxide film formed by means of a low-pressure chemical vapor deposition (LPCVD) method or an atmospheric pressure chemical vapor deposition (APCVD) method.

The substrate 1 is a semiconductor substrate, such as a silicon substrate, or an insulating substrate, such as a quartz substrate or a ceramic substrate. Although unillustrated, an isolation region is formed in the substrate 1 beforehand. Further, a well region and a channel region of a transistor (not shown) are formed beforehand in an active region of the substrate 1 other than the isolation region.

Next, a first silicon film 3 is formed on the gate oxide film 2 to a thickness of 40 to 100 nm. Here, the first silicon film 3 is a polycrystalline silicon film or an amorphous silicon film which is formed by means of the CVD technique and doped with an impurity such as phosphorus (P).

Next, a silicide film 4 is formed on the first silicon film 3 to a thickness of 40 to 120 nm. The silicide film 4 is a silicide film formed from a high-melting-point metal film, such as titanium (Ti), tantalum (Ta), tungsten (W), cobalt (Co), nickel (Ni), or molybdenum (Mo); or a multilayer film consisting of a combination of these silicide films.

A dielectric film 5 is formed on the silicide film 4 to a thickness of 20 to 100 nm. Here, the dielectric film 5 assumes high etch selectivity to the first silicon film 3 and the silicide film 4. For instance, the dielectric film 5 is a nitride (Si$_3$N$_4$) or nitride oxide (SiON) film deposited by the CVD technique, or a two-layer film (multilayer film) consisting of an oxide film (SiO$_2$) and a nitride film (Si$_3$N$_4$).

Figure 2:
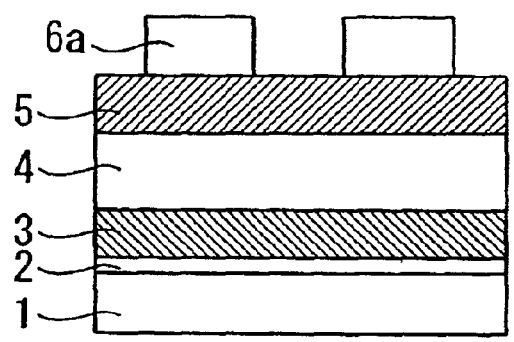

Next, as shown in FIG. 2, a resist pattern 6a is formed on the dielectric film 5 through the photolithography process.

Figure 3:
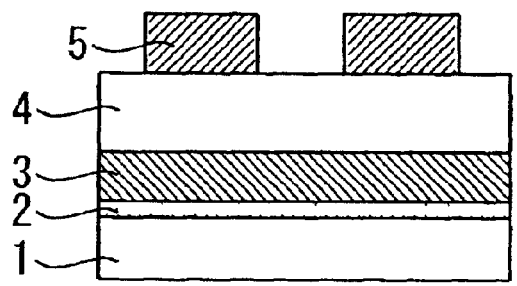

Next, as shown in FIG. 3, the dielectric film 5 is patterned by means of dry etching while the resist pattern 6a is taken as a mask. Subsequently, the resist pattern 6a is removed.

Figure 4:
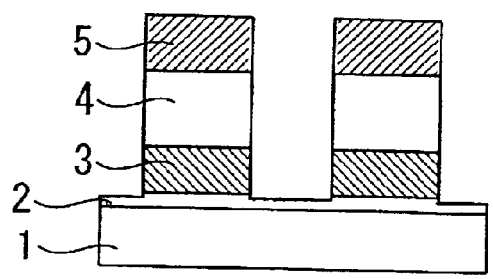

Next, as shown in FIG. 4, the silicide film 4 and the first silicon film 3 are patterned by means of dry etching while the thus-patterned dielectric film 5 is taken as a mask. As a result, a gate interconnection having a desired geometry is formed.

The etching operation is performed under process conditions featuring a high etch selectivity to a silicon oxide film. Accordingly, etching action is stopped at a point within the gate oxide film 2 (see FIG. 4).

Figure 5:
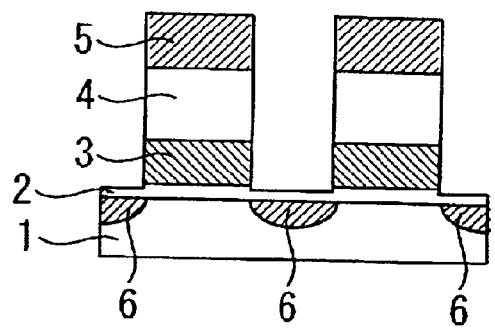

Next, as shown in FIG. 5, an impurity is implanted into the substrate 1 while the gate interconnections are taken as masks, thereby forming source/drain regions as first diffusion layers 6 in the substrate 1.

Here, a p-type impurity such as boron (B), or an n-type impurity such as phosphorus (P) or arsenic (As) is selected as an impurity to be implanted into the substrate 1 in accordance with the type of a transistor to be fabricated, as required.

A doping concentration (atoms/cm$^2$) of the first diffusion layer 6 is on the order of $1 \times 10^{13 \ through \ 14}$.

Figure 6:
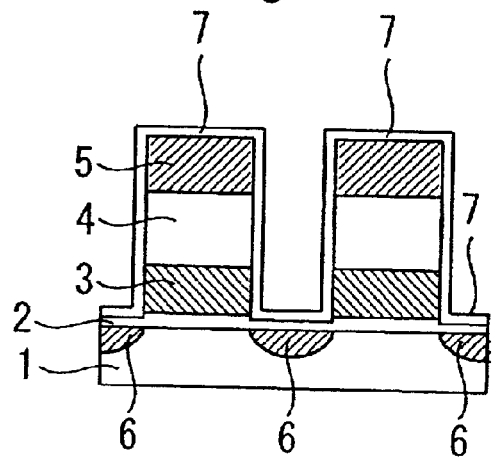

Next, as shown in FIG. 6, by means of the CVD technique, a second silicon film 7 is formed at a temperature of 700° C. or less to a thickness of 5 to 20 nm, over the entire surface of the substrate 1 so as to cover the gate interconnections. Here, the second silicon film 7 is a non-doped silicon film; for example, a polycrystalline silicon film or an amorphous silicon film.

Figure 7:
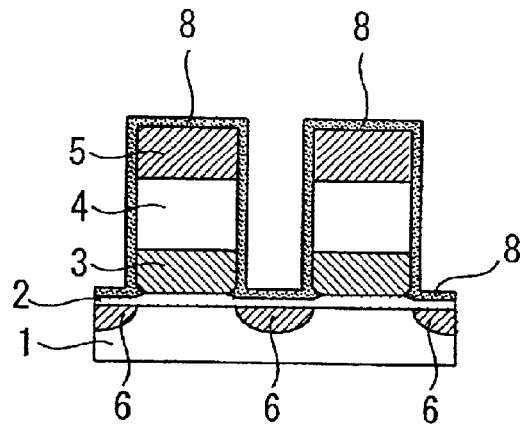

As shown in FIG. 7, the second silicon film 7 is subjected to thermal oxidation, thereby forming a thermal oxide film 8.

Here, thermal oxidation is dry reflow involving heat treatment in an O$_2$ atmosphere at a temperature of 700 to 1200° C. or wet reflow involving heat treatment in an H$_2$O atmosphere at a temperature of 700 to 1200° C.

As compared with dry reflow, wet reflow is higher in oxidation rate. More specifically, when thermal oxidation is performed under a given set of processing conditions (i.e., a processing temperature and a processing time), wet reflow oxidizes silicon in greater volume than does dry reflow.

In a thermal oxidation process, gate edges (i.e., edges of a gate interconnection) are rounded by the thermal oxide film 8, thereby forming gate bird's beaks (see FIG. 7). More specifically, oxidation seeds are supplied to gate edges from the side and from below, thereby forming gate bird's beaks.

Figure 8:
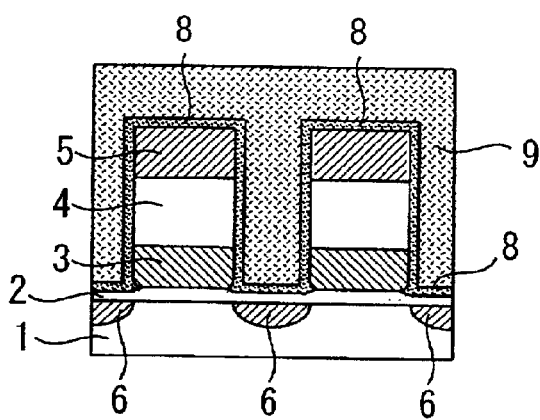

Next, as shown in FIG. 8, an interlayer dielectric film 9 is formed to a thickness of 300 to 1000 nm over the entire surface of the substrate 1. Here, an oxide film; e.g., boron-and-phosphorus-doped BPTEOS (boro-phospho tetraethylorthosilicate) or PTEOS (phosphorus tetraethylorthosilicate), is employed as the interlayer dielectric film 9. These oxide films have a high embedding characteristic and a high degree of flatness, which are required by the interlayer dielectric film 9.

Finally, although not shown in the drawings, the substrate 1 is subjected to dry reflow at a temperature of 700 to 1000° C. Here, dry reflow means heat treatment to be performed in an O$_2$ or N$_2$ atmosphere. As a result, the substrate 1 can be prevented oxidizing.

The semiconductor device manufactured by the foregoing manufacturing method comprises the substrate 1; the gate oxide film 2 formed on the substrate 1; gate interconnections, each including the first silicon film 3, the silicide film 4, and the dielectric film 5; the thermal oxide film 8 formed over the entire surface of the substrate 1 so as to cover the gate interconnections; and the interlayer dielectric film 9 formed on the thermal oxide film 8. A side surface of the dielectric film 5, a side surface of the first silicon film 3, and a side surface of the silicide film 4 constitute a single plane.

The thermal oxide film 8 is formed on the side surface of each of the gate interconnections. The thermal oxide film 8 does not spread into the first silicon film 3 or the silicide film 4. The thermal oxide film 8 is formed to a uniform thickness on the side surfaces of each of the gate interconnections. No volume expansion arises in the silicide film 4, nor does the silicide film 4 spread into the lower first silicon film 3.

As described above, under the method of manufacturing a semiconductor device according to the first embodiment, after formation of the gate interconnections, the second silicon film 7 is formed so as to cover the gate interconnections. The substrate 1 is subjected to thermal oxidation for thermally oxidizing the second silicon film 7, thereby forming the thermal oxide film 8 and gate bird's beaks on the gate edges.

In the first embodiment, in order to form the thermal oxide film 8 by means of subjecting only the second silicon film 7 to thermal oxidation, the silicide film 4 and the first silicon film 3, which constitute gate interconnections, are not oxidized. More specifically, the thermal oxide film 8 does not spread into the gate interconnection beyond the side surface of the dielectric film 5. In other words, the side surface of the dielectric film 5 is flush with the side surface of the silicide film 4 and the side surface of the first silicon film 3. Accordingly, the gate interconnections are not narrowed, and an increase in the resistance of the gate interconnections can be prevented.

Since the silicide film 4 is not oxidized during the thermal oxidation operation, a deficiency of silicon components in the silicide film 4 does not arise. Accordingly, the silicide film 4 does not take up silicon components from the lower silicon film 3. Hence, occurrence of volume expansion in the silicide film 4 can be prevented, thereby preventing stress on the gate oxide film 2, which would otherwise be imposed in a conventional semiconductor device. As a result, the reliability of a semiconductor device can be improved.

In the first embodiment, the thermal oxide film 8 is formed on the sidewalls of the gate interconnections to a uniform thickness. Accordingly, the thermal oxide film 17a formed on the side surfaces of the silicide film 4 can be prevented from becoming greater in thickness than the thermal oxide film 17b formed on the side surfaces of the silicon film 3.

Accordingly, the space between the gate interconnections can be readily embedded with the interlayer dielectric film 9 without involvement of embedding failures.

As mentioned above, the second silicon film 7 is subjected to thermal oxidation through wet reflow, whereby the second silicon film 7 achieves a high oxidation rate.

Even under device limitations; particularly, the constraint that, for reasons of influence to a transistor characteristic, a device must be used under a condition producing a low thermal-oxidation rate, such as a low temperature or a short period of time, a thermal oxide film of desired thickness can be readily formed (the same also applies to the second through sixth embodiments to be described later).

In the first embodiment, the gate interconnections are formed from the first silicon film 3, the silicide film 4, and the dielectric film 5. However, the silicide film 4 is not required (the same also applies to the second through sixth embodiments to be described later). Even in this case, the second silicon film 7 covering the gate interconnections is subjected to thermal oxidation. Hence, the first silicon film 3 is not thermally oxidized. Accordingly, the gate interconnection width is not narrowed, thereby preventing an increase in the resistance of the gate interconnections.

Although the second silicon film 7 is embodied in the form of a non-doped silicon film, a silicon film doped with P or As may also be employed (the same also applies to a second silicon film employed in the second through sixth embodiments to be described later). In addition to the foregoing advantages, there is also yielded an advantage of a doped silicon film achieving a higher oxidation rate than that achieved by the non-doped silicon film 7.

Accordingly, even under device limitations; particularly, the constraint that, for reasons of influence to a transistor characteristic, a device must be used under a condition that produces low thermal-oxidation rate, such as a low temperature or a short period of time, a thermal oxide film of desired thickness can be readily formed.

Figure 9:
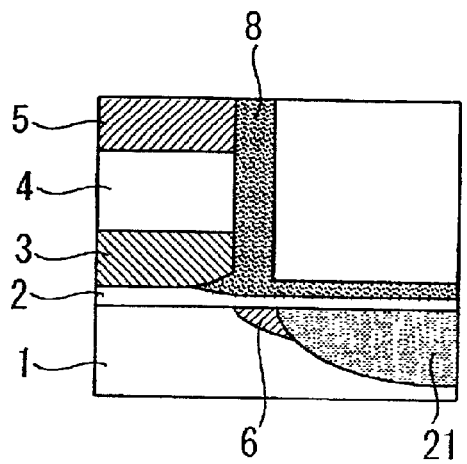
FIG. 9 is a cross-sectional view for describing the formation of a first diffusion layer in a first embodiment of the present invention.

As shown in FIG. 9, after formation of the thermal oxide film 8 through thermal oxidation, a second diffusion layer (i.e., a source/drain region) 21 having a higher doping concentration than that of the first diffusion layer 6 may also be formed, by means of doping the substrate 1 while the thermal oxide film is taken as a mask (the same also applies to the second through sixth embodiments). As a result, there is formed a transistor of LDD structure, and hence a hot carrier characteristic of the transistor can be further improved.

Here, the second diffusion layer 21 assumes a doping concentration (atoms/cm$^2$) on the order of 1×10$^{15}$ (the same also applies to the second embodiment to be described later).

Moreover, the source/drain region 21 is formed in a self-aligned manner, and hence forming sidewalls made from a nitride film on the side surfaces of the gate interconnections is obviated. Accordingly, since the number of processes for forming an LDD structure is reduced, costs for manufacturing a semiconductor device can be suppressed.

Second Embodiment

Figure 10:
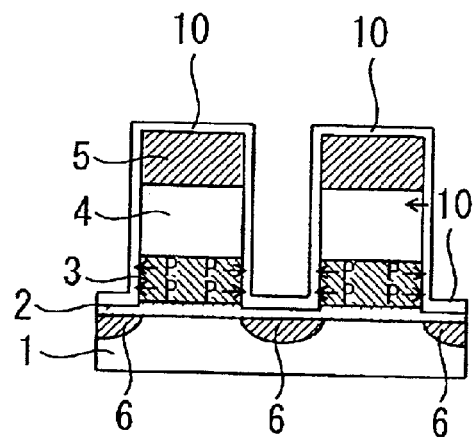
FIGS. 10 through 12 are cross-sectional views for describing a method of manufacturing a semiconductor device according to a second embodiment of the present invention.
Figure 11:
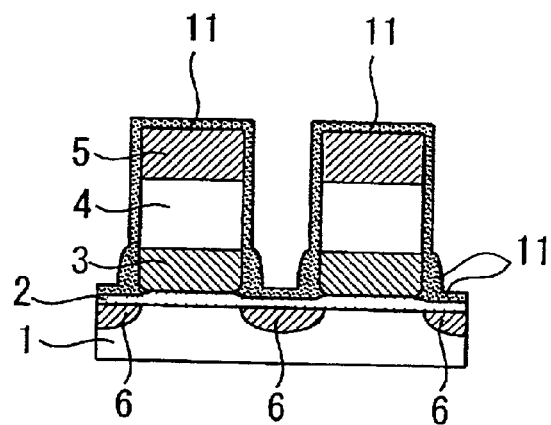
Figure 12:
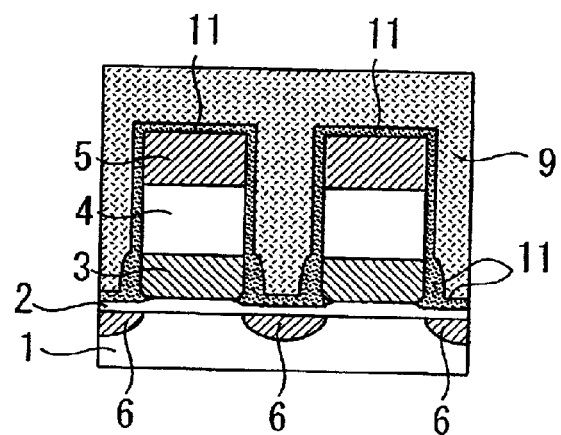

FIGS. 10 through 12 are cross-sectional views for describing a method of manufacturing a semiconductor device according to a second embodiment of the present invention.

A difference between the second embodiment and the first embodiment lies in a process of forming a second silicon film (to be described in detail later).

A method of manufacturing a semiconductor device according to the second embodiment will now be described.

Processing identical with that shown in FIGS. 1 through 5 and described in connection with the first embodiment is performed before processing shown in FIG. 10.

Next, as shown in FIG. 10, through the CVD technique, a second silicon film 10 is formed at a temperature higher then 700° C. to a thickness of 5 to 20 nm over the entire surface of the substrate 1 so as to cover the gate interconnections.

The second silicon film 10 is a non-doped silicon film; for example, a polycrystalline silicon film or an amorphous silicon film.

In contrast with the first embodiment, in the second embodiment the second silicon film 10 is formed at a high temperature. During formation of the film 10, phosphorus contained in the first silicon film 3 diffuses within the first silicon film, 3 and migrates from the side surfaces of the first silicon film 3 into the second silicon film 10 (as indicated by the arrow shown in FIG. 10). More specifically, the second silicon film 10 formed on the side surfaces of the first silicon film 3 contains an impurity (e.g. phosphorus) at high concentration.

Next, as shown in FIG. 11, the second silicon film 10 is subjected to thermal oxidation by the same method as that described in connection with the first embodiment (see FIG. 7), thereby forming a thermal oxide film 11.

In general, a silicon film including an impurity such as phosphorus is oxidized at a higher rate than is a non-doped silicon film. For this reason, the second silicon film 10 formed on the side surfaces of the first silicon film 3 is higher in oxidation rate than the second silicon film 10 formed on the other areas. Therefore, as shown in FIG. 11, the thermal oxide film 11 formed on the side surfaces of the first silicon oxide film 3 become thicker than the thermal oxide film 11 formed on the side surfaces of the silicide film 4. As a result, the space between the gate interconnections assumes a reversely-tapered profile.

Through the thermal oxidation process, the gate edges are rounded by the thermal oxide film 11, thereby forming gate bird's beaks (see FIG. 11).

Next, as shown in FIG. 12, the interlayer dielectric film 9 is formed over the entire surface of the substrate 1 to a thickness of 300 to 1000 nm by means of the same method as that described in connection with the first embodiment (see FIG. 8).

Finally, although not illustrated, the substrate 1 is subjected to dry reflow at a temperature of 700 to 1000° C., thereby preventing oxidation of the substrate 1.

A semiconductor device manufactured under the above-mentioned manufacturing method comprises the substrate 1; the gate oxide film 2 formed on the substrate 1; gate interconnections each including the first silicon film 3, the silicide film 4, and the dielectric film 5; the thermal oxide film 11 formed over the entire surface of the substrate 1 so as to cover the gate interconnections; and the interlayer dielectric film 9 formed on the thermal oxide film 11. The side surface of the dielectric film 5, that of the first silicon film 3, and that of the silicide film 4 constitute a single plane.

More specifically, the thermal oxide film 11 is formed on the side surfaces of each of the gate interconnections. The thermal oxide film 11 does not spread into the first silicon film 3 or the silicide film 4. The thermal oxide film 11 covering the side surfaces of the silicide film 4 are thicker than those covering the side surfaces of the first silicon film 3. No volume expansion arises in the silicide film 4, and the silicide film 4 does not spread into the lower first silicon film 3.

As described above, under the method of manufacturing a semiconductor device according to the second embodiment, after formation of the gate interconnections, the second silicon film 10 covering the gate interconnections is formed at a temperature higher than 700° C. The substrate 1 is then subjected to thermal oxidation. whereby the second silicon film 10 is thermally oxidized thus forming the thermal oxide film 11 and forming gate bird's beaks on the gate edges.

The second embodiment yields the same advantage as that yielded in the first embodiment.

In the second embodiment, the second silicon film 10 is formed at a temperature higher than 700° C. As result, during formation of the second silicon film 10, phosphorus implanted as an impurity into the first silicon film 3 diffuses into the second silicon film 10 located on the sides of the first silicon film 3. A silicon film having impurity implanted therein is thermally oxidized at a high rate. Hence, the thermal oxide film 11 formed on the side surfaces of the first silicon film 3 becomes thicker than the thermal oxide film 11 formed on the side surfaces of the silicide film 4. Hence, the space between the gate interconnections assumes a reversely-tapered profile, and the interlayer dielectric film 9 can be embedded more readily than in the first embodiment.

Figure 13:
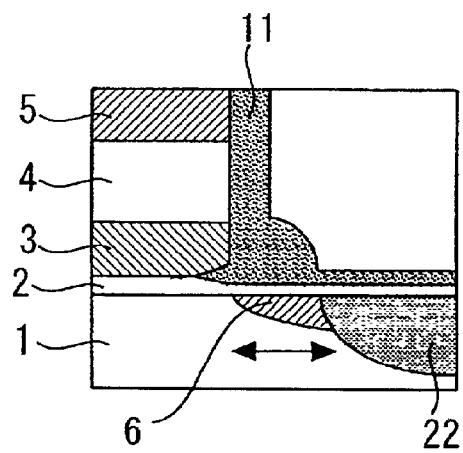
FIG. 13 is a cross-sectional view for describing the formation of a second diffusion layer in a second embodiment of the present invention.

As shown in FIG. 13, after formation of the thermal oxide film 11 through thermal oxidation, an impurity is implanted into the substrate 1 while the thermal oxide film 11 is taken as a mask, thereby forming a second diffusion layer (source/drain region) 22. As a result, there is formed a transistor of LDD structure, thereby improving the hot carrier characteristic of a transistor.

Since the source/drain region 22 is formed in a self-aligned manner, there is no necessity of forming sidewalls made from a nitride film on the side surfaces of the gate interconnections. Accordingly, the number of processes for forming an LDD structure can be diminished, thereby reducing costs for manufacturing a semiconductor device.

The thermal oxide film 11 formed on the side surfaces of the first silicon film 3 is thicker than the thermal oxide film 8 (see FIG. 9) formed in the first embodiment, and hence there is yielded an advantage of an increase in the degree of freedom to obtain a desired LDD structure.

The second diffusion layer 22 can be formed in a desired position, by means of controlling the thickness of the thermal oxide film 11 formed on the side surfaces of the first silicon film 3 through thermal oxidation. Further, the thickness of the thermal oxide film 11 can be controlled, by means of the concentration of impurity to be diffused from the first silicon film 3 and a thermal oxidation time.

A modification of the method of manufacturing a semiconductor device according to the second embodiment will now be described.

Figure 14:
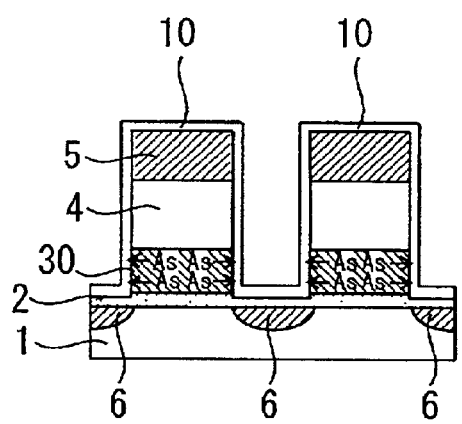
FIG. 14 is a cross-sectional view for describing a modification of the method of manufacturing a semiconductor device according to the second embodiment.

FIG. 14 is a cross-sectional view for describing a modification of the method of manufacturing a semiconductor device according to the second embodiment.

The manufacturing method according to the present modification is identical with that described in connection with the second embodiment, except that a first silicon film 30 doped with arsenic (As) is employed instead Of the first silicon film 3 doped with phosphorus (P). Hence, repeated explanations of the second embodiment are omitted.

As shown in FIG. 14, the second silicon film 10 is formed over the entire surface of the substrate 1 so as to cover the gate interconnections, in the same manner as that shown in FIG. 10. Here, formation of the second silicon film 10 is performed at a temperature higher than 700° C.

As mentioned above, an impurity (i.e., As) contained in the first silicon film 30 diffuses into the second silicon film 10. Here, arsenic (As) contained in a silicon film diffuses at higher speed than does phosphorus (P).

Accordingly, the amount of impurity migrating to the second silicon film 10 is increased, and the thermal oxidation rate of the second silicon film 10 becomes much faster. Hence, a thermal oxide film formed on the side surfaces of the first silicon film 30 can be made thicker than the thermal oxide film 11 formed in the second embodiment. As a result, embedding the space between gate interconnections with an interlayer dielectric film is further facilitated.

The present modifications suitable for a case where difficulty is encountered in embedding the space between gate interconnections with an interlayer dielectric film under restrictions related to structure or processing.

Third Embodiment

Figure 15:
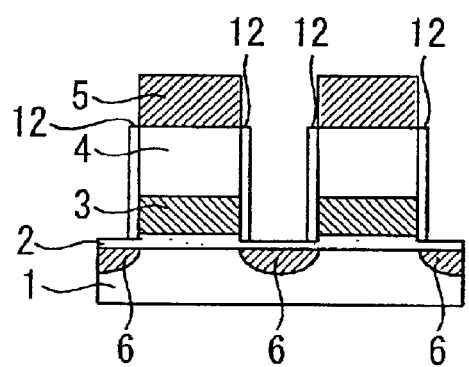
FIGS. 15 through 17 are cross-sectional views for describing a method of manufacturing a semiconductor device according to a third embodiment of the present invention.
Figure 16:
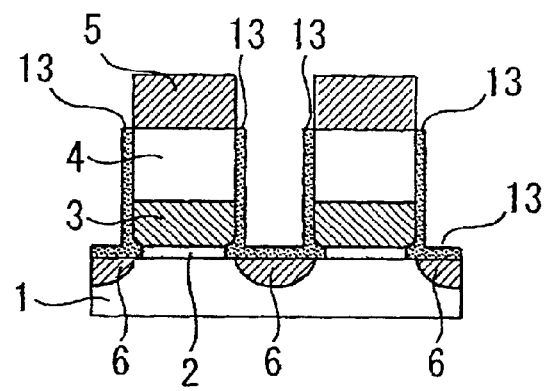
Figure 17:
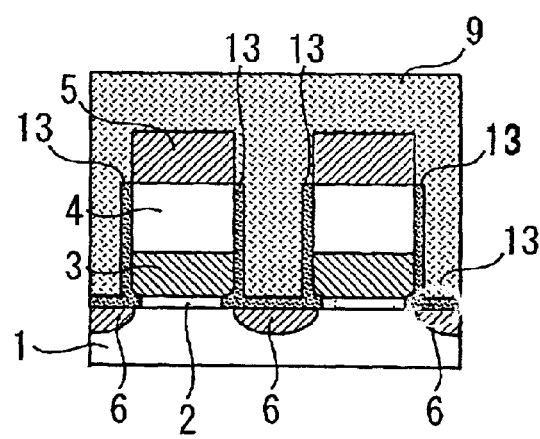

FIGS. 15 through 17 are cross-sectional views for describing a method of manufacturing a semiconductor device according to a third embodiment of the present invention.

The method of manufacturing a semiconductor device according to the third embodiment will now be described.

Before processing pertaining to a process shown in FIG. 15 is performed, processing identical with that pertaining to the processes which are shown in FIGS. 1 through 5 and described in connection with the first embodiment is performed.

Next, as shown in FIG. 15, by means of the selective growth technique a second silicon film 12 is formed at a temperature of 700° C. or less to a thickness of 5 to 20 nm on the side surfaces of the first silicon film 3 and on those of the silicide film 4, the films 3 and 4 constituting the gate interconnections.

Here, the second silicon film 12 is a non-doped silicon film.

Next, as shown in FIG. 16, the second silicon film 12 is subjected to thermal oxidation in the same manner as that described in connection with the first embodiment (see FIG. 7), thereby forming a thermal oxide film 13.

Through the thermal oxidation process gate edges are rounded by means of the thermal oxide film 13 through the thermal oxidation process thus forming gate bird's beaks.

Next, as shown in FIG. 17, the interlayer dielectric film 9 is formed over the entire surface of the substrate 1 to a thickness of 300 to 1000 nm in the same manner as that described in connection with the first embodiment (see FIG. 8).

Finally, although not illustrated, the substrate 1 is subjected to dry reflow at a temperature of 700 to 1000° C., thereby preventing oxidation of the substrate 1.

The semiconductor device manufactured under the foregoing manufacturing method comprises the substrate 1; the gate oxide film 2 formed on the substrate 1; gate interconnections, each comprising the first silicon film 3, the silicide film 4, and the dielectric film 5; the thermal oxide film 13 covering only the side surfaces of the first silicon film 3 and those of the silicide film 4; and the interlayer dielectric film 9 formed over the entire surface of the substrate 1 so as to cover the gate interconnections. A side surface of the dielectric film 5, a side surface of the first silicon film 3, and a side surface of the silicide film 4 constitute a single plane.

The thermal oxide film 13 is formed on the side surfaces of the first silicon film 3 and those of the silicide film 4, the films 3 and 4 constituting the gate interconnections, and the thermal oxide film 13 is not formed on the side surfaces of the dielectric film 5. The thermal oxide film 13 does not spread into the first silicon film 3 and the silicide film 4. The thermal oxide film 13 is formed to a uniform thickness on the side surfaces of each of the gate interconnections. No volume expansion arises in the silicide film 4, and the silicide film 4 does not spread into the lower first silicon film 3.

As described above, under the method of manufacturing a semiconductor device according to the third embodiment, after formation of the gate interconnections, the second silicon film 12 is formed so as to cover the first silicon film 3 and the silicide film 4, the films 3 and 4 constituting the gate interconnections. The substrate 1 is subjected to thermal oxidation to thermally oxidize the second silicon film 12, thereby forming the thermal oxide film 13 and gate bird's beaks on the gate edges.

In the third embodiment, since the thermal oxide film 13 is formed by means of subjecting only the second silicon film 12 to thermal oxidation, the silicide film 4 and the first silicon film 3, which constitute gate interconnections, are not oxidized. More specifically, the thermal oxide film 13 does not spread into the gate interconnection beyond the side surface of the dielectric film 5. In other words, the side surface of the dielectric film 5 is flush with the side surface of the silicide film 4 and the side surface of the first silicon film 3. Accordingly, the gate interconnections are not narrowed, and an increase in the resistance of the gate interconnections can be prevented.

Since the silicide film 4 is not oxidized during the thermal oxidation operation, a deficiency of silicon components in the silicide film 4 does not arise. Accordingly, occurrence of volume expansion in the silicide film 4 can be prevented, thereby preventing stress on the gate oxide film 2, which would otherwise be imposed in a conventional semiconductor device. As a result, the reliability of a semiconductor device can be improved.

In the third embodiment, the thermal oxide film 13 is not formed on the sidewalls of the dielectric film 5, thereby ensuring a wide opening for embedding the interlayer dielectric film 9. Accordingly, embedding the space between the gate interconnections with the interlayer dielectric film 9 can be performed more easily than in the first and second embodiments.

Fourth Embodiment

Figure 18:
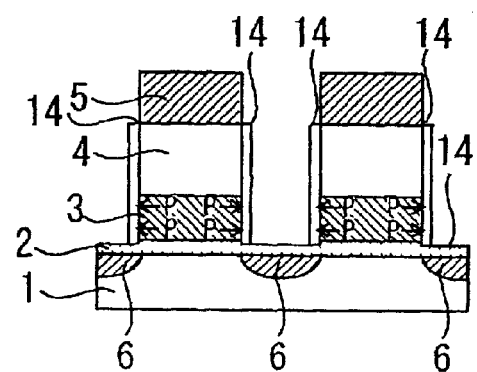
FIGS. 18 through 20 are cross-sectional views for describing a method of manufacturing a semiconductor device according to a fourth embodiment of the present invention.
Figure 19:
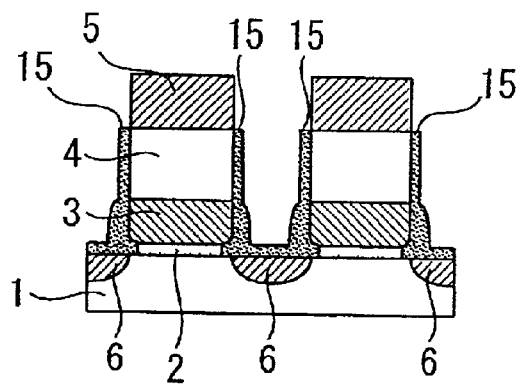
Figure 20:
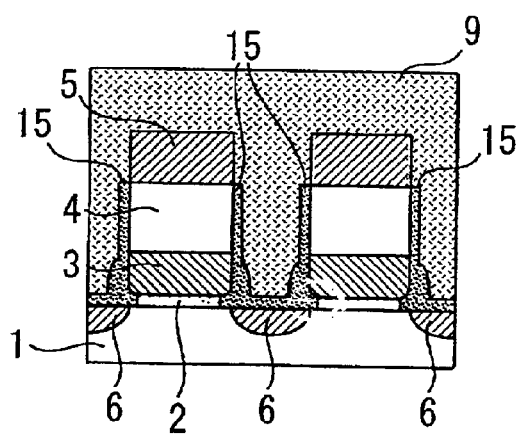

FIGS. 18 through 20 are cross-sectional views for describing a method of manufacturing a semiconductor device according to a fourth embodiment of the present invention.

The method of manufacturing a semiconductor device according to the fourth embodiment will now be described.

Before processing pertaining to a process shown in FIG. 18 is performed, processing identical with that pertaining to the processes which are shown in FIGS. 1 through 5 and described in connection with the first embodiment is performed.

Next, as shown in FIG. 18, by means of the selective growth technique a second silicon film 14 is formed at a temperature higher than 700° C. to a thickness of 5 to 20 nm on the side surfaces of the first silicon film 3 and on those of the silicide film 4, the films 3 and 4 constituting the gate interconnections.

In contrast with the third embodiment, in the fourth embodiment the second silicon film 14 is formed at a temperature exceeding 700° C. When the second silicon film 14 is formed at a high temperature, phosphorus contained in the first silicon film 3 diffuses during the course of formation of the second silicon film 14, and the thus-diffusing phosphorus migrates from the side surfaces of the first silicon film 3 into the second silicon film 14 (as indicated by an arrow shown in FIG. 18). The second silicon film 14 formed on the side surfaces of the first silicon film 3 contains an impurity (phosphorus) at high concentration.

Next, as shown in FIG. 19, the second silicon film 14 is subjected to thermal oxidation in the same manner as that described in connection with the first embodiment (see FIG. 7), thereby forming a thermal oxide film 15.

Here, a silicon film containing an impurity, such as phosphorus, is oxidized at higher rate than is a non-doped silicon film. For this reason, the second silicon film 14 formed on the side surfaces of the first silicon film 3 is higher in oxidation rate than the second silicon film formed on the other areas. Therefore, as shown in FIG. 19, the thermal oxide film 15 formed on the side surfaces of the first silicon film 3 become thicker than the thermal oxide film 15 formed on the side surfaces of the silicide film 4.

Through the thermal oxidation process, gate edges are rounded by means of the thermal oxide film 15, thereby forming gate bird's beaks (see FIG. 19).

Next, as shown in FIG. 20, the interlayer dielectric film 9 is formed to a thickness of 300 to 1000 nm over the entire surface of the substrate 1 by the same method as that described in connection with the first embodiment (see FIG. 8).

Finally, although not illustrated, the substrate 1 is subjected to dry reflow at 700 to 1000° C., thereby preventing oxidation of the substrate 1.

The semiconductor device manufactured under the foregoing manufacturing method comprises the substrate 1; the gate oxide film 2 formed on the substrate 1; gate interconnections, each comprising the first silicon film 3, the silicide film 4, and the dielectric film 5; a thermal oxide film 15 covering only the side surfaces of the first silicon film 3 and those of the silicide film 4; and the interlayer dielectric film 9 formed over the entire surface of the substrate 1 so as to cover the gate interconnections. A side surface of the dielectric film 5, a side surface of the first silicon film 3, and a side surface of the silicide film 4 constitute a single plane.

The thermal oxide film 15 is formed on the side surfaces of the first silicon film 3 and those of the silicide film 4, the films 3 and 4 constituting the gate interconnections. The thermal oxide film 15 does not spread into the first silicon film 3 and the silicide film 4. The thermal oxide film 15 covering side surfaces of the silicide film 4 is thicker than that covering side surfaces of the first silicon film 3. No volume expansion arises in the silicide film 4, and the silicide film 4 does not spread into the lower first silicon film 3.

As described above, under the method of manufacturing a semiconductor device according to the fourth embodiment, after formation of the gate interconnections, the second silicon film 14 covering the first silicon film 3 and the silicide film 4 of the gate interconnections is formed at high temperature. The second silicon film 14 is subjected to thermal oxidation, thereby forming the thermal oxide film 15 and gate bird's beaks on the gate edges.

The fourth embodiment yields the same advantage as that yielded by the third embodiment.

In the fourth embodiment, since the second silicon film 14 is formed at a temperature higher than 700° C., phosphorus implanted as an impurity into the first silicon film 3 diffuses into the second silicon film 14 from the side surfaces of the first silicon film 3 during the course of formation of the second silicon film 14. A silicon film having impurity implanted therein is thermally oxidized at a high rate. Hence, the thermal oxide film 15 formed on the side surfaces of the first silicon film 3 become thicker than the thermal oxide film 15 formed on the side surfaces of the silicide film 4. Hence, the space between the gate interconnections assumes a reversely-tapered profile, and the interlayer dielectric film 9 can be embedded more readily than in the third embodiment.

A modification of the method of manufacturing a semiconductor device according to the fourth embodiment will now be described.

Figure 21:
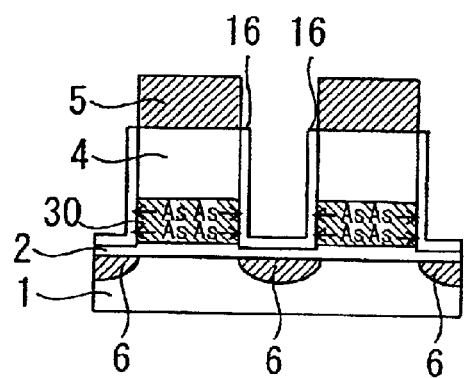
FIG. 21 is a cross-sectional view for describing a modification of the method of manufacturing a semiconductor device according to the fourth embodiment.

FIG. 21 is a cross-sectional view for describing a modification of the method of manufacturing a semiconductor device according to the fourth embodiment.

The manufacturing method according to the present modification is identical with that described in connection with the fourth embodiment, except that a first silicon film 30 doped with arsenic (As) is employed instead of the first silicon film 3 doped with phosphorus (P). Hence, repeated explanations of the fourth embodiment are omitted.

As shown in FIG. 21, a second silicon film 16 is formed on side surfaces of the first silicon film 30 and side surfaces of the silicide film 4, the two films 30 and 4 constituting gate interconnections, by the same method as that shown in FIG. 18. Here, growth (formation) of the second silicon film 16 is performed at a temperature higher than 700° C.

As mentioned above, an impurity (i.e., As) contained in the first silicon film 30 diffuses into the second silicon film 16. Arsenic (As) contained in a silicon film diffuses at higher speed than does phosphorus (P).

Accordingly, the amount of impurity migrating to the second silicon film 16 is increased, and the thermal oxidation rate of the second silicon film 16 becomes much faster. Hence, a thermal oxide film formed on the side surfaces of the first silicon film 30 can be made thicker than the thermal oxide film 15 formed in the fourth embodiment. As a result, embedding the space between gate interconnections with an interlayer dielectric film is further facilitated.

The present modification is suitable for a case where difficulty is encountered in embedding the space between gate interconnections with an interlayer dielectric film under restrictions related to structure or processing.

Fifth Embodiment

Figure 22:
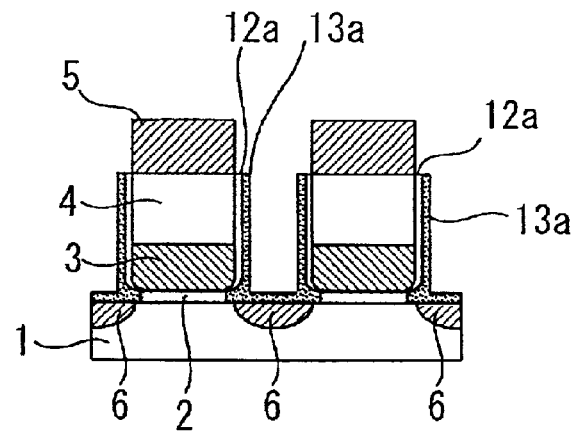
FIGS. 22 and 23 are cross-sectional views for describing a method of manufacturing a semiconductor device according a fifth embodiment of the present invention.
Figure 23:
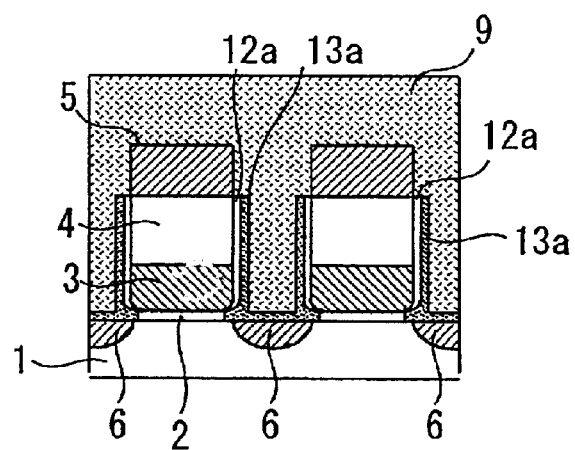

FIGS. 22 and 23 are cross-sectional views for describing a method of manufacturing a semiconductor device according a fifth embodiment of the present invention.

A method of manufacturing a semiconductor device according to the fifth embodiment will now be described.

Before processing pertaining to a process shown in FIG. 22 is performed, processing identical with that pertaining to the processes which are shown in FIGS. 1 through 5 and described in connection with the first embodiment is performed.

Then, the process which is shown in FIG. 15 and is described in connection with the third embodiment is performed. More specifically, by means of the selective growth technique, the second silicon film 12 is formed at a temperature of 700° C. or less to a thickness of 5 to 20 nm on the side surfaces of the first silicon film 3 and on those of the silicide film 4, the films 3 and 4 constituting the gate interconnections.

Next, as shown in FIG. 22, the second silicon film 12 is thermally oxidized by the same method as that described in connection with the first embodiment (see FIG. 7).

The surface of the second silicon film 12 is thermally oxidized, thereby forming a thermal oxide layer 13a, and a second silicon layer 12a is left between the thermal oxide layer 13a and the gate interconnections. In other words, the second silicon layer 12a for covering the side surfaces of the silicide film 4 and those of the first silicon film 3, the films 3 and 4 constituting the gate interconnections, and the thermal oxide layer 13a for covering the second silicon layer 12a are formed in the form of two-layer film (multilayer film).

Through thermal oxidation, a portion of the second silicon film 12; that is, one-third to two-thirds of the second silicon film 12, is thermally oxidized, thereby forming the thermal oxide layer 13a.

Next, as shown in FIG. 23, the interlayer dielectric film 9 is formed to a thickness of 300 to 1000 nm over the entire surface of the substrate 1 by the same method as that described in connection with the first embodiment (see FIG. 8).

Finally, although not illustrated, the substrate 1 is subjected to dry reflow at the temperature of 700 to 1000° C., thereby preventing oxidation of the substrate 1.

The semiconductor device manufactured under the foregoing manufacturing method comprises the substrate 1; the gate oxide film 2 formed on the substrate 1; gate interconnections, each comprising the first silicon film 3, the silicide film 4, and the dielectric film 5; a second silicon layer 12a covering only the side surfaces of the first silicon film 3 and those of the silicide film 4; the thermal oxide layer 13a for covering the second silicon film 12a; and the interlayer dielectric film 9 formed over the entire surface of the substrate 1 so as to cover the gate interconnections. A side surface of the dielectric film 5, a side surface of the first silicon film 3, and a side surface of the silicide film 4 constitute a single plane.

The two-layer film consisting of the second silicon layer 12a and the thermal oxide layer 13a is formed on the side surfaces of the first silicon film 3 and those of the silicide film 4, the films 3 and 4 constituting the gate interconnections. The thermal oxide layer 13a does not spread into the first silicon film 3 and the silicide film 4.

The thermal oxide layer 13a is formed on the side surfaces of the gate interconnections to a uniform thickness. No volume expansion arises in the silicide film 4, and the silicide film 4 does not spread into the lower first silicon film 3.

As described above, under the method of manufacturing a semiconductor device according to the fifth embodiment, after formation of the gate interconnections, the second silicon film 12 covering the first silicon film 3 and the silicide film 4 of the gate interconnections is formed. The thermal oxide layer 13a is formed by means of thermally oxidizing the second silicon film 12 by a predetermined thickness thereby forming gate bird's beaks on the gate edges.

In the fifth embodiment, the surface of the second silicon film 12 is subjected to thermal oxidation, thereby forming the thermal oxide layer 13a. Hence, the silicide film 4 and the first silicon film 3, which constitute gate interconnections, cannot be oxidized. Hence, there is yielded the same advantage as that yielded in the third embodiment.

The second silicon layer 12a is interposed between the side surface of the gate interconnection and the thermal oxide layer 13a. Hence, the resistance of gate interconnections can be reduced as compared with the third embodiment, thereby improving the characteristic of a transistor.

Sixth Embodiment

Figure 24:
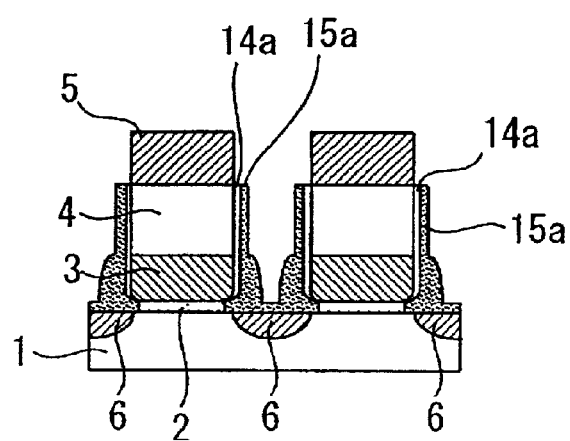
FIGS. 24 and 25 are cross-sectional views for describing a method of manufacturing a semiconductor device according to a sixth embodiment of the present invention.
Figure 25:
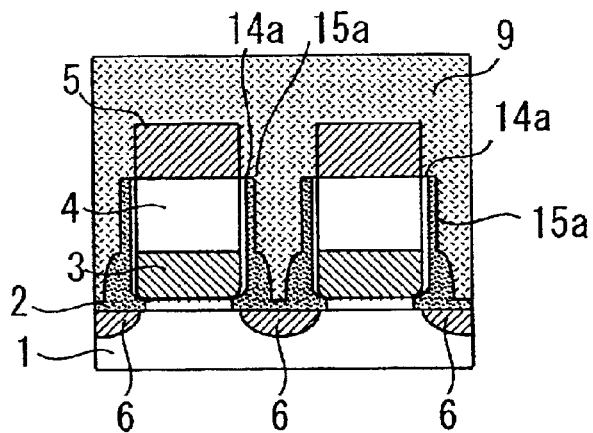
Figure 26:
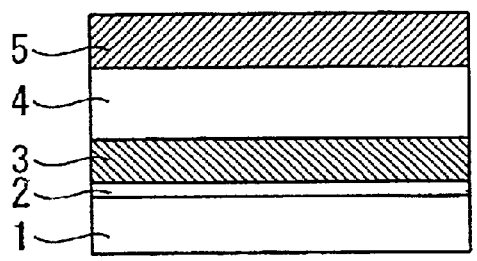
FIGS. 26 through 31 are cross-sectional views for describing a conventional method of manufacturing a semiconductor device.
Figure 27:
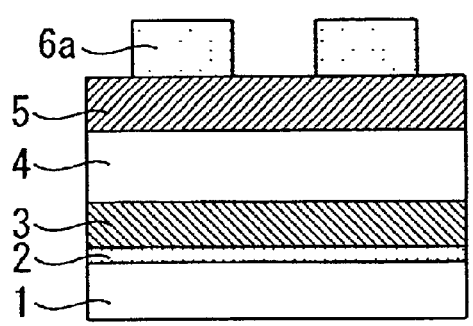
Figure 28:
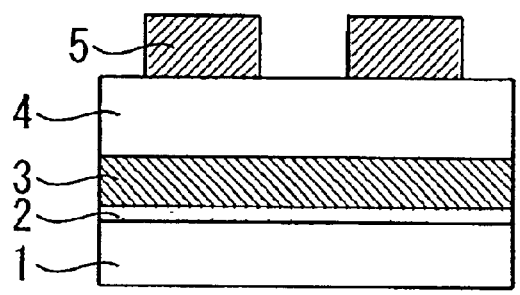
Figure 29:
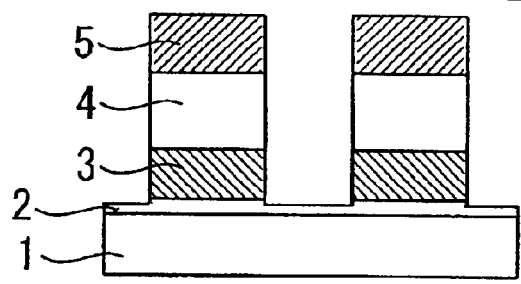
Figure 30:
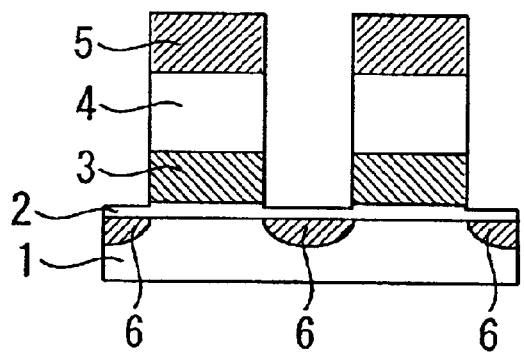
Figure 31:
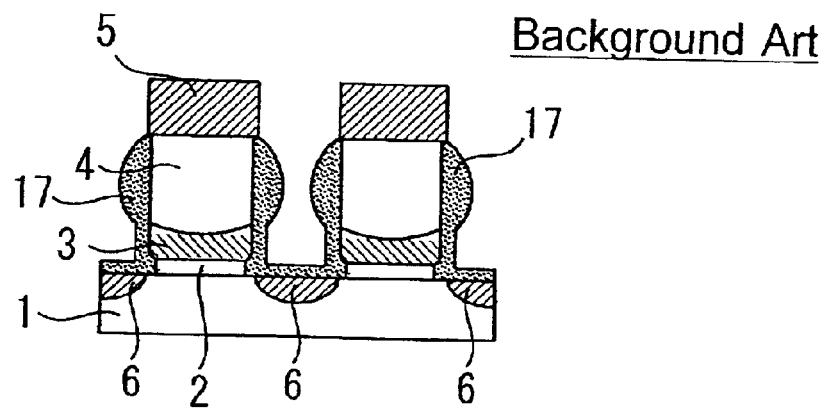
Figure 32:
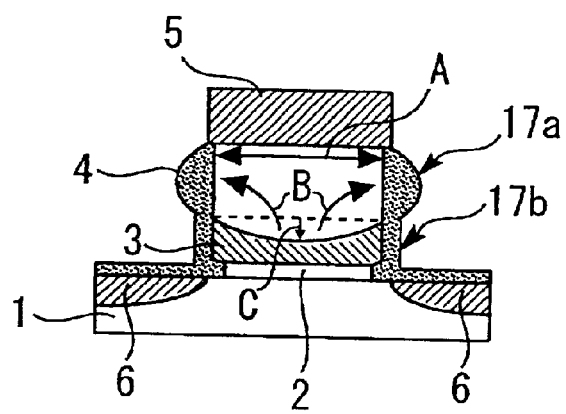
FIG. 32 is a cross-sectional view for describing a semiconductor device manufactured by the conventional manufacturing method.
Figure 33:
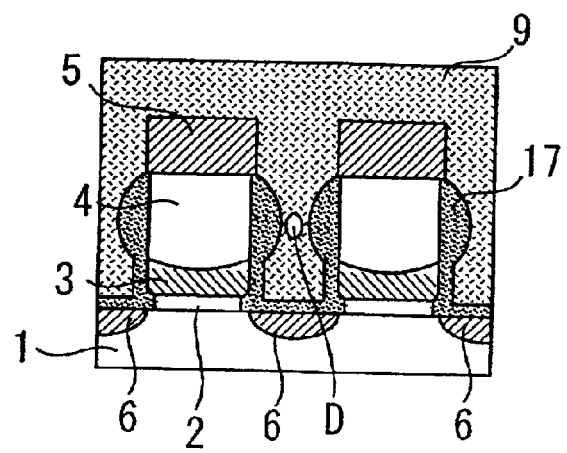
FIG. 33 is a cross-sectional view for describing that embedding failures have occurred in an interlayer dielectric film of the semiconductor device manufactured by the conventional manufacturing method.

FIGS. 24 and 25 are cross-sectional views for describing a method of manufacturing a semiconductor device according to a sixth embodiment of the present invention.

A method of manufacturing a semiconductor device according to the sixth embodiment will now be described.

Before processing pertaining to a process shown in FIG. 24 is performed, processing identical with that pertaining to the processes which are shown in FIGS. 1 through 5 and described in connection with the first embodiment is performed.

Then, the process which is shown in FIG. 18 and is described in connection with the fourth embodiment is performed. More specifically, by means of the selective growth technique the second silicon film 14 is formed at a temperature higher than 700° C. to a thickness of 5 to 20 nm on the side surfaces of the first silicon film 3 and on those of the silicide film 4, the films 3 and 4 constituting the gate interconnections. As described in connection with the fourth embodiment, phosphorus contained in the first silicon film 3 has diffused into the portion of the second silicon film 14 grown from the side surfaces of the first silicon film 3, and hence, the portion is higher in doping concentration of phosphorus than the other portion of the second silicon film 14.

Next, as shown in FIG. 24, the surface of the second silicon film 14 is thermally oxidized by the same method as that described in connection with the fifth embodiment (see FIG. 22), thereby forming the thermal oxide layer 15a. The second silicon layer 14a is left between the thermal oxide layer 15a and gate interconnections. In other words, the second silicon layer 14a for covering the side surfaces of the silicide film 4 and those of the first silicon film 3, the films 3 and 4 constituting the gate interconnections, and the thermal oxide layer 15a for covering the second silicon layer, 14a are formed in the form of two-layer film (multilayer film).

Through thermal oxidation, a portion of the second silicon film 14; that is, one-third to two-thirds of the second silicon film 14, is thermally oxidized, thereby forming the thermal oxide layer 15a.

In the fifth embodiment, the second silicon film 14 is formed at a temperature higher than 700° C. As mentioned above, the second silicon film 14 grown from the side surfaces of the first silicon film 3 includes a high concentration of an impurity (phosphor) and hence is oxidized at a high rate.

Accordingly, the thermal oxide layer 15a formed on the side surfaces of the first silicon film 3 are thicker than the thermally oxide layer 15a formed on the side surfaces of the silicide film 4.

Next, as shown in FIG. 25, the interlayer dielectric film 9 is formed to a thickness of 300 to 1000 nm over the entire surface of the substrate 1 by the same method as that described in connection with the first embodiment (see FIG. 8).

Finally, although not illustrated, the substrate 1 is subjected to dry reflow at the temperature of 700 to 1000° C., thereby preventing oxidation of the substrate 1.

The semiconductor device manufactured under the foregoing manufacturing method comprises the substrate 1; the gate oxide film 2 formed on the substrate 1; gate interconnections, each comprising the first silicon film 3, the silicide film 4, and the dielectric film 5; a second silicon layer 14a covering only the side surfaces of the first silicon film 3 and those of the silicide film 4; the thermal oxide layer 15a for covering the second silicon layer 14a; and the interlayer dielectric film 9 formed over the entire surface of the substrate 1 so as to cover the gate interconnections. A side surface of the dielectric film 5, a side surface of the first silicon film 3, and a side surface of the silicide film 4 constitute a single plane.

Specifically, a two-layer film consisting of the second silicon layer 14a and the thermal oxide layer 15a is formed on the side surfaces of the first silicon film 3 and those of the silicide film 4, the films 3 and 4 constituting the gate interconnections. The thermal oxide layer 15a does not spread into the first silicon film 3 and the silicide film 4. No volume expansion arises in the silicide film 4, and the silicide film 4 does not spread into the lower first silicon film 3.

In contrast with the fifth embodiment, in the sixth embodiment the thermal oxide layer 15a covering the side surfaces of the silicide film 4 is thicker than the thermal oxide layer 15a covering the side surface of the first silicon film 3.

As described above, under the method of manufacturing a semiconductor device according to the sixth embodiment, after formation of the gate interconnections, the second silicon film 14 covering the first silicon film 3 and the silicide film 4, the films 3 and 4 constituting the gate interconnections, is formed. The second silicon film 14 is thermally oxidized by only a predetermined thickness, thereby forming the thermal oxide layer 15a and forming gate bird's beaks on the gate edges.

The sixth embodiment yields the same advantage as that yielded in the fifth embodiment.

In the sixth embodiment, the second silicon film 14 is formed at a temperature higher than 700° C. As a result, phosphorus implanted as an impurity into the first silicon film 3 diffuses into the second silicon film 14 located on the sides of the first silicon film 3 during formation of the second silicon film 14. A silicon film having impurity implanted therein is thermally oxidized at a high rate. Hence, the thermal oxide layer 15a formed on the side surfaces of the first silicon film 3 becomes thicker than the thermal oxide layer 15a formed on the side surfaces of the silicide film 4. Hence, the space between the gate interconnections assumes a reversely-tapered profile, and the interlayer dielectric film 9 can be embedded more readily than in the third embodiment.

This invention, when practiced illustratively in the manner described above provides the following major effects:

The present invention enables formation of gate bird's beaks without involvement of an increase in the resistance of gate interconnections.

Embedding the space between gate interconnections with an interlayer dielectric film can be performed readily.

Further, the present invention is not limited to these embodiments, but variations and modifications may be made without departing from the scope of the present invention.

The entire disclosure of Japanese patent application no. 2001-116398 filed on Apr. 16, 2001 containing specification, claims, drawings and summary are incorporated herein by reference in its entirety.

What is claimed is:

1. A method of manufacturing a semiconductor device, comprising the steps of:

forming a gate oxide film on a substrate;

forming gate interconnections on the gate oxide film, each gate interconnection including a first silicon film, forming an interface with an upper surface of the gate oxide film, and a dielectric film;

forming a first diffusion layer by means of implanting an impurity into the substrate while the gate interconnections are taken as a mask;

forming a second silicon film over the entire surface of the substrate so as to cover the gate interconnections, after formation of the first diffusion layer;

thermally-oxidizing the second silicon film, thereby forming a thermal oxide film with a bird's beak extending into the interface; and forming an interlayer dielectric film on the thermal oxide film.

2. The method of manufacturing a semiconductor device according to claim 1, wherein each of the gate interconnections includes a silicide film interposed between the first silicon film and the dielectric film.

3. The method of manufacturing a semiconductor device according to claim 1, wherein the first silicon film is a doped silicon film, and the second silicon film is formed at a temperature higher than 700° C.

4. The method of manufacturing a semiconductor device according to claim 1, wherein the second silicon film is a doped silicon film.

5. The method of manufacturing a semiconductor device according to claim 1, further comprising a step of forming, after formation of the thermal oxide film and prior to formation of the interlayer dielectric film, a second diffusion layer which is higher in impurity concentration than the first diffusion layer, by means of implanting an impurity into the substrate while the thermal oxide film is taken as a mask.

6. A method of manufacturing a semiconductor device, comprising the steps of:

forming a gate oxide film on a substrate;

forming gate interconnections on the gate oxide film, each gate interconnection including a first silicon film, forming an interface with an upper surface of the gate oxide film, and a dielectric film;

forming a first diffusion layer by means of implanting an impurity into the substrate while the gate interconnections are taken as a mask;

forming, after formation of the first diffusion layer, a second silicon film over the side surfaces of the first silicon film;

thermally-oxidizing the second silicon film, thereby forming a thermal oxide film with a bird's beak extending into the interface; and forming, after formation of the thermal oxide film, an interlayer dielectric film over the entire surface of the substrate so as to cover the gate interconnections.

7. The method of manufacturing a semiconductor device according to claim 6, wherein each of the gate interconnections includes a silicide film interposed between the first silicon film and the dielectric film, and the second silicon film covers side surfaces of the first silicon film and those of the silicide.

8. The method of manufacturing a semiconductor device according to claim 6, wherein the first silicon film is a doped silicon film, and the second silicon film is formed at a temperature higher than 700° C.

9. The method of manufacturing a semiconductor device according to claim 6, wherein the second silicon film is a doped silicon film.

10. The method of manufacturing a semiconductor device according to claim 6, further comprising a step of forming, after formation of the thermal oxide film and prior to formation of the interlayer dielectric film, a second diffusion layer which is higher in impurity concentration than the first diffusion layer, by means of implanting an impurity into the substrate while the thermal oxide film is taken as a mask.

11. The method of manufacturing a semiconductor device according to claim 6, wherein in the step of thermally-oxidizing the second silicon film, the surface of the second silicon film is thermally-oxidized, thereby forming a layer of thermal oxide film and leaving a second silicon film between the layer of the thermal oxide film and the gate interconnections.

12. The method of manufacturing a semiconductor device according to claim 11, wherein one-third to two-thirds of the second silicon film is thermally oxidized thereby forming the layer of the thermal oxide film.

13. The method of manufacturing a semiconductor device according to claim 1, wherein the second silicon film is thermally oxidized at a temperature of 700 to 1200° C.

14. The method of manufacturing a semiconductor device according to claim 6, wherein the second silicon film is thermally oxidized at a temperature of 700 to 1200° C.

* * * * *